(12) United States Patent
Gao et al.

(10) Patent No.: US 10,141,029 B2
(45) Date of Patent: Nov. 27, 2018

(54) SECURING APPARATUS FOR DATA STORAGE DEVICE

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Wen-Ju Gao, Wuhan (CN); Bi Zheng, Wuhan (CN); Fang-Peng Yu, Wuhan (CN); Xiao-Zhong Jing, Wuhan (CN); Yi-Sheng Lin, New Taipei (TW)

(73) Assignees: HONG FU JIN PRECISION INDUSTRY (WuHan CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 147 days.

(21) Appl. No.: 15/235,117

(22) Filed: Aug. 12, 2016

(65) Prior Publication Data
US 2017/0372756 A1    Dec. 28, 2017

(30) Foreign Application Priority Data
Jun. 28, 2016  (CN) .......................... 2016 1 0484022

(51) Int. Cl.
| G11B 33/12 | (2006.01) |
| H05K 5/02 | (2006.01) |
| G06F 1/18 | (2006.01) |
| H05K 7/14 | (2006.01) |
| E05B 65/00 | (2006.01) |

(52) U.S. Cl.
CPC ............ *G11B 33/124* (2013.01); *G06F 1/187* (2013.01); *H05K 5/0221* (2013.01); *E05B 65/006* (2013.01); *G06F 1/181* (2013.01); *G06F 1/186* (2013.01); *H05K 7/1405* (2013.01)

(58) Field of Classification Search
CPC .......... G06F 1/181; G06F 1/187; G06F 1/186; E05B 65/006; H05K 5/0221; H05K 7/1405; G11B 33/124
USPC ........... 312/223.1, 223.2, 265.6; 361/679.58, 361/679.59, 726
See application file for complete search history.

(56) References Cited

U.S. PATENT DOCUMENTS

| 6,231,144 B1 * | 5/2001 | Chen .................... H05K 7/1411 312/223.2 |
| 6,375,287 B1 * | 4/2002 | Lai .......................... G06F 1/181 292/302 |

(Continued)

*Primary Examiner* — Jonathan Liu
*Assistant Examiner* — Taylor L Morris
(74) *Attorney, Agent, or Firm* — ScienBiziP, P.C.

(57) ABSTRACT

A securing apparatus configured to mount a data storage device in an enclosure includes a shielding assembly configured to be secured to a panel of the enclosure and a sliding pole. The shielding assembly includes a frame and a rotating plate rotatably mounted to the frame. The sliding pole is slidably mounted to the frame and defines a plurality of latching slots. The frame defines an aperture for the data storage device to pass through; the rotating plate comprises a plurality of hooks. The sliding pole is slidable relative to the frame to engage the hooks in the latching slots. The rotating plate is secured to the frame and shields the aperture, preventing the data storage device from being taken out of the enclosure.

12 Claims, 11 Drawing Sheets

(56) References Cited

U.S. PATENT DOCUMENTS

| | | | | |
|---|---|---|---|---|
| 6,398,325 B1* | 6/2002 | Chen | G06F 1/181 | 292/128 |
| 6,549,397 B1* | 4/2003 | Diaz | G06F 1/181 | 312/223.1 |
| 6,775,144 B2* | 8/2004 | Gan | G06F 1/181 | 312/223.1 |
| 7,082,036 B2* | 7/2006 | Cheng | G06F 1/181 | 292/19 |
| 7,142,431 B2* | 11/2006 | Li | G06F 1/181 | 361/726 |
| 7,152,443 B2* | 12/2006 | Chang | E05B 65/006 | 70/352 |
| 7,265,986 B2* | 9/2007 | Chen | G06F 1/181 | 361/726 |
| 7,272,011 B2* | 9/2007 | Chen | G06F 1/181 | 361/726 |
| 7,315,457 B1* | 1/2008 | Chen | G06F 1/184 | 312/223.2 |
| 7,428,146 B2* | 9/2008 | Han | G06F 1/181 | 312/223.2 |
| 7,471,507 B2* | 12/2008 | Huang | G06F 1/184 | 312/223.2 |
| 7,539,010 B2* | 5/2009 | Chen | G06F 1/181 | 361/679.58 |
| 7,635,811 B2* | 12/2009 | Chen | G06F 1/181 | 174/50 |
| 7,672,124 B2* | 3/2010 | Zhang | G06F 1/181 | 361/679.57 |
| 8,111,518 B2* | 2/2012 | Lee | H05K 7/1405 | 361/726 |
| 8,348,358 B2* | 1/2013 | Huang | G06F 1/181 | 312/223.2 |
| 8,632,140 B2* | 1/2014 | Chen | G06F 1/181 | 312/223.2 |
| 2003/0147207 A1* | 8/2003 | Syring | G06F 1/184 | 361/679.57 |
| 2004/0170007 A1* | 9/2004 | Chen | G06F 1/184 | 361/801 |
| 2005/0040740 A1* | 2/2005 | Yun | G06F 1/181 | 312/223.2 |
| 2005/0047080 A1* | 3/2005 | Hsu | G06F 1/184 | 361/679.41 |
| 2009/0168341 A1* | 7/2009 | Zhang | G06F 1/186 | 361/679.58 |
| 2009/0213535 A1* | 8/2009 | Zhang | G11B 33/02 | 361/679.31 |
| 2010/0172082 A1* | 7/2010 | Chen | G06F 1/187 | 361/679.31 |
| 2010/0223761 A1* | 9/2010 | Chen | G06F 1/181 | 24/1 |
| 2010/0232104 A1* | 9/2010 | Tang | E05B 65/006 | 361/679.58 |
| 2011/0156549 A1* | 6/2011 | Zhang | H05K 5/02 | 312/223.1 |
| 2012/0013233 A1* | 1/2012 | Chen | G06F 1/181 | 312/327 |
| 2012/0262038 A1* | 10/2012 | Zeng | G06F 1/181 | 312/223.2 |
| 2013/0147324 A1* | 6/2013 | Chen | G06F 1/181 | 312/223.1 |
| 2014/0028164 A1* | 1/2014 | Chen | G06F 1/181 | 312/223.2 |
| 2014/0110233 A1* | 4/2014 | Cheng | H01H 9/20 | 200/325 |

* cited by examiner

SECURING APPARATUS FOR DATA STORAGE DEVICE

FIELD

The subject matter herein generally relates to securing apparatus for data storage devices.

BACKGROUND

A storage device can store a mass of information and be mounted within an enclosure of the electronic device. The enclosure generally defines an opening for the data storage device mounting, and the data storage device can be taken out of the opening easily.

BRIEF DESCRIPTION OF THE DRAWINGS

Implementations of the present technology will now be described, by way of example only, with reference to the attached figures.

DETAILED DESCRIPTION

Figure 1:
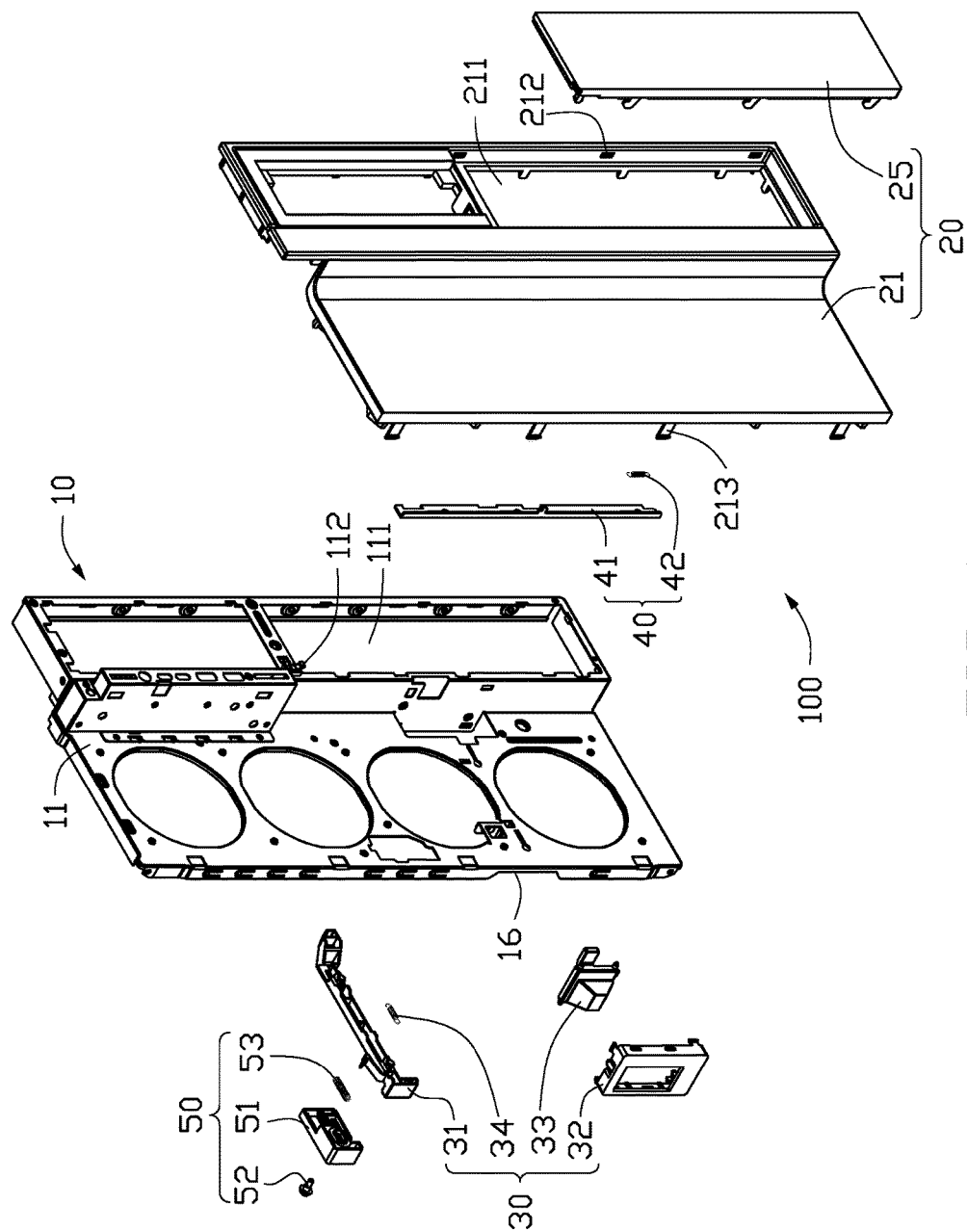
FIG. 1 is an exploded, isometric view of one embodiment of a securing apparatus and a panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

FIG. 1 illustrates a securing apparatus 100 in an embodiment. The securing apparatus 100 is configured to secure a data storage device in an enclosure (not shown). The enclosure can comprise a panel 10. The securing apparatus 100 can include a shielding assembly 20, a pressing module 30, a sliding module 40, and a switch module 50.

Figure 2:
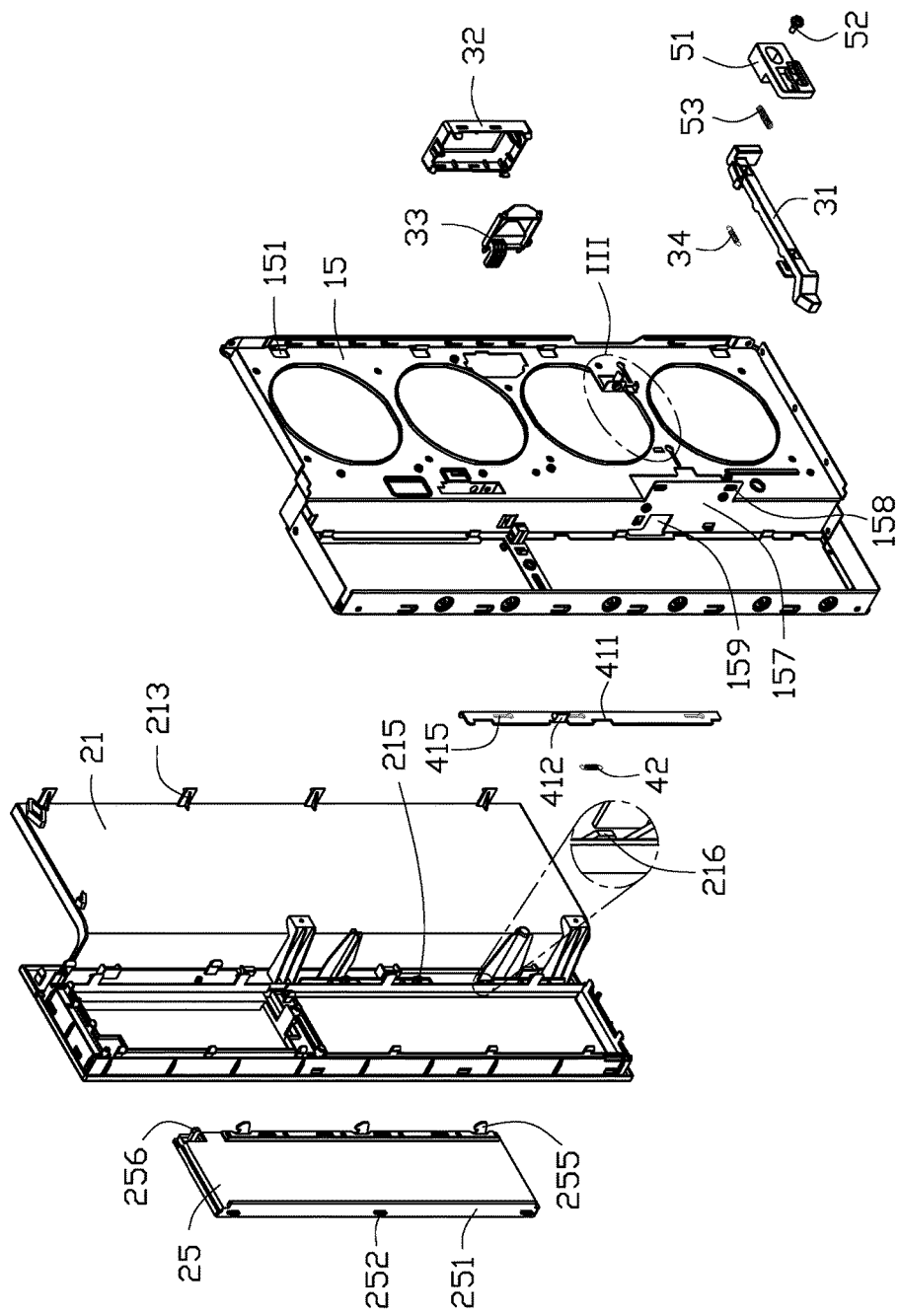
FIG. 2 is similar to FIG. 1, but viewed from a different angle.
Figure 3:
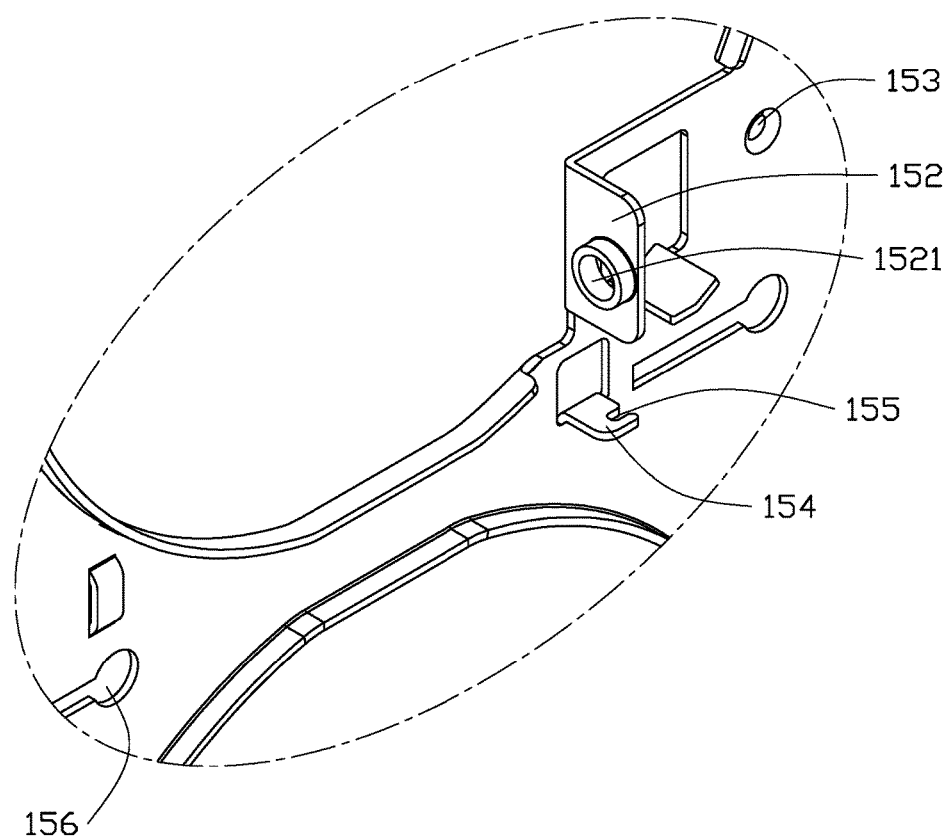
FIG. 3 is an enlarged view of a circled portion III of FIG. 2.

Referring to FIGS. 1-3, the panel 10 can include a front surface 11 and a rear surface 15. The shielding assembly 20 is secured to the front surface 11. The front surface 11 defines an opening 111 configured for entry of a data storage device. A locking member 112, configured to securing the shielding assembly 20, extends from the front surface 11 and is above the opening 111.

A plurality of latching slots 151 and a limiting plate 152 extend from the rear surface 15. The limiting plate 152 defines a limiting hole 1521. The rear surface 15 defines a positioning hole 153 beside the limiting plate 152. A holding plate 154 extends substantially perpendicularly from the rear surface 15 below the limiting plate 152. The holding plate 154 defines a latching hole 155. The rear surface 15 further defines two sliding slots 156 below the limiting plate 152. The two sliding slot 156 extend in a straight line opposite to each other. An installation plate 157 extends from the rear surface 15 in a side of the opening 111. The installation plate 157 defines a plurality of installation holes 158 and a receiving hole 159. A cutout 16 is defined in the panel 10 away from the installation plate 157.

The shielding assembly can include a frame 21 and a rotating plate 25 rotatably mounted to the frame 21. The frame 21 defines an aperture 211 corresponding to the opening 111, the data storage device can be received in the enclosure through the aperture 211 and the opening 111. The frame 21 defines a plurality of pivoting holes 212 in a side of the aperture 211. A plurality of hooks 213, a limiting block 216, and two sliding posts 215 extend from the frame 21. Each hook of the plurality of hooks 213 is elastically deformable to engage in the latching slots 151, to secure the shielding assembly 20 to the panel 10.

A flange 251 extends from a side of the rotating plate 25. A plurality of posts 252 extends from the flange 251 and is capable of inserting into the pivoting holes 212. A plurality of hooks 255 extends from a side of the rotating plate 25 and each of such hooks 255 is engageable with the sliding module 40. A pin 256 extends from the rotating plate 25 above the plurality of hooks 255 and is capable of inserting into the locking member 112 to secure the rotating plate 25 to the frame 21.

Figure 4:
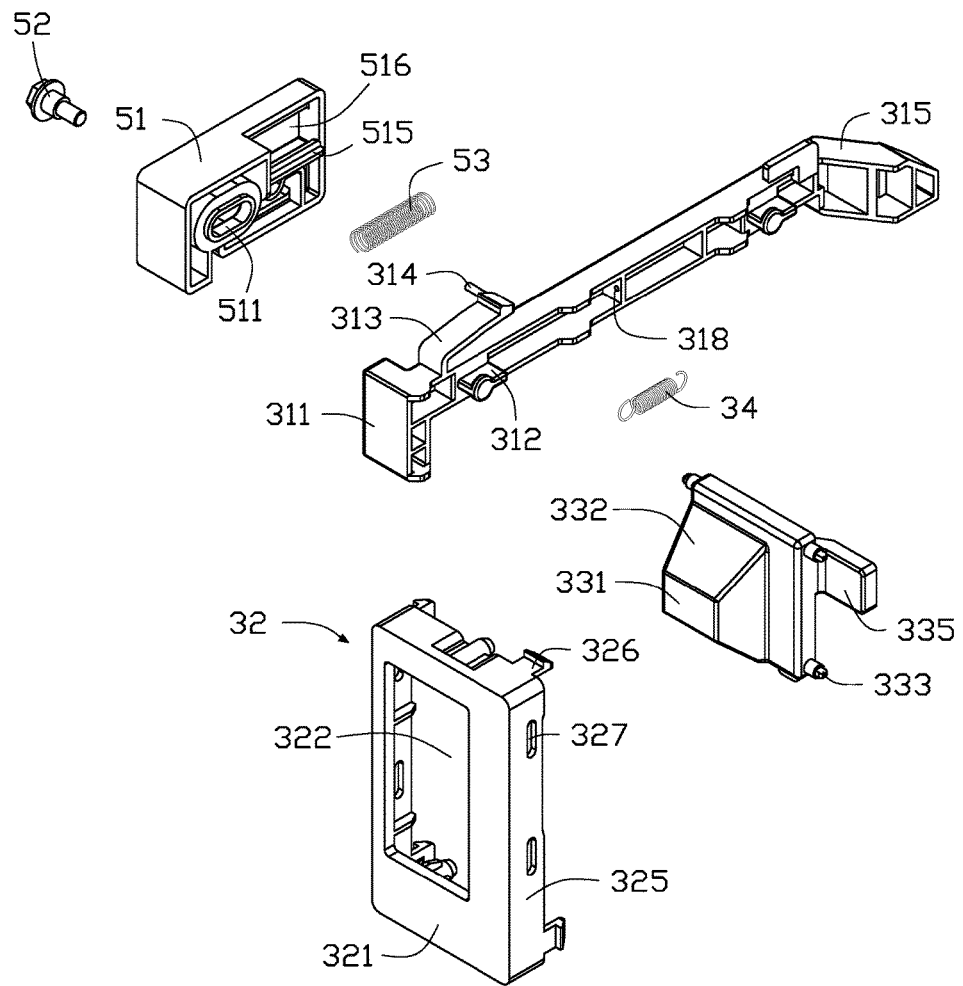
FIG. 4 is an exploded, isometric view of a pressing module and a switch module of the securing apparatus of FIG. 1.
Figure 5:
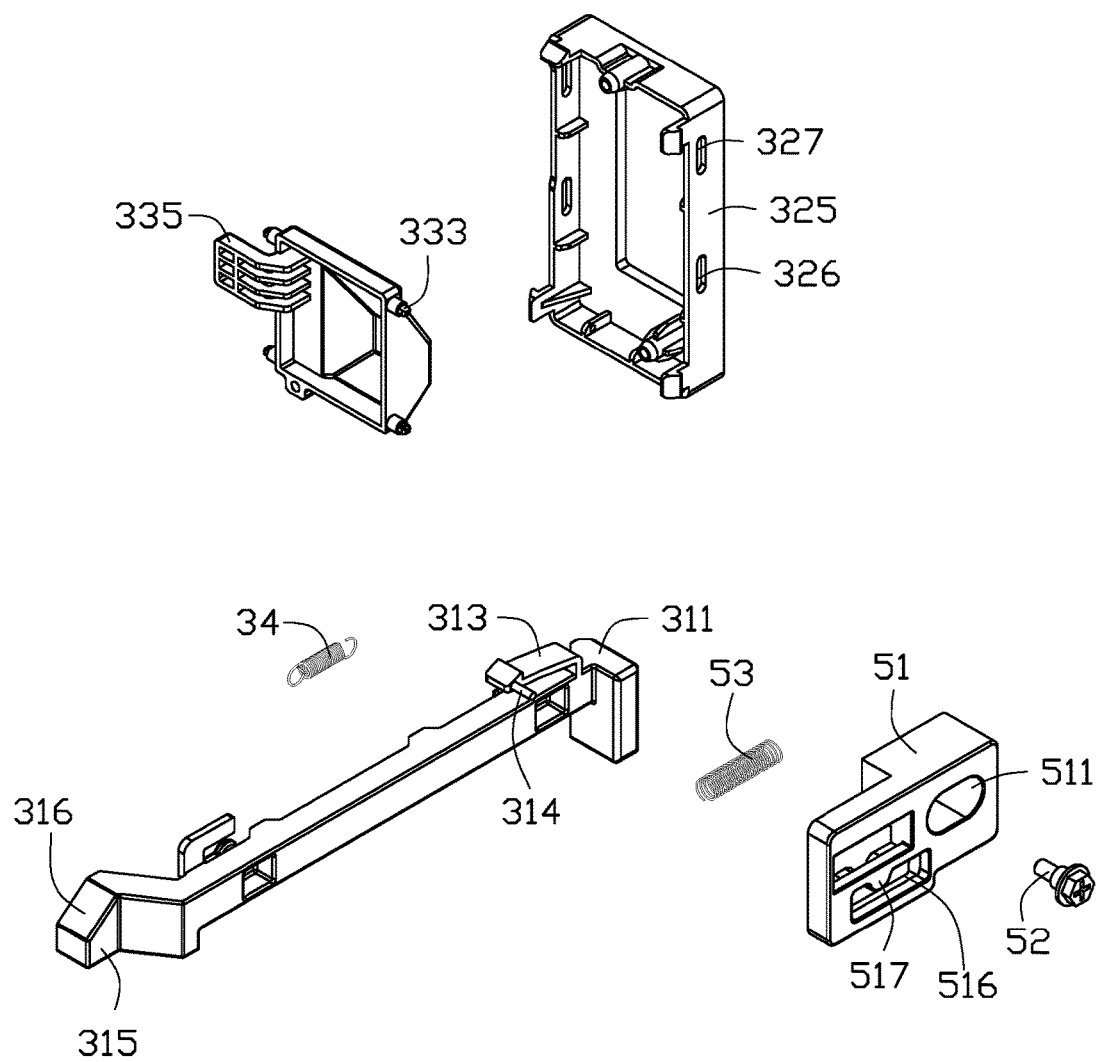
FIG. 5 is similar to FIG. 4, but viewed from a different angle.

FIGS. 4 and 5 illustrate that the pressing module 30 can include an operation pole 31, a bracket 32, a sliding member 33, and a first resilient member 34.

The operation pole 31 can include an operation plate 311, two sliding posts 312, a blocking plate 313, a blocking pole 314 extending outwards from a terminal side of the blocking plate 313, and a pressing block 315. The operation plate 311 is operable to allow the operation pole 31 to slide. The blocking plate 313 is elastically deformable. The pressing block 315 can include two guiding surfaces 316 capable of pushing the sliding member 33. The operation pole 31 further defines a latching hole 318. The first resilient member 34 is elastically deformable to latch a first end in the latching hole 318 and a second end in the latching hole 155.

The bracket 32 can include a top wall 321 and four sidewalls 325 extending from edges of the top wall 321. The top wall 321 defines a through hole 322 for the sliding member 33 to slide through. A hook 326 extends from each sidewall 325 and is engageable in the installation hole 158 to secure the bracket 32 to the panel 10. Two of the sidewalls 325 each defines two sliding slots 327 for receiving the sliding member 33.

The sliding member 33 can include a protrusion 331, two sliding shafts 333, and a pushing plate 335. The protrusion 331 is substantially pyramid shaped and includes four slant surfaces 332. One of the slant surfaces 332 abuts one of the guiding surfaces 316. The sliding shafts 333 are capable of being slidably inserted in the sliding slots 327. The pushing plate 335 is configured to slide the sliding module 40 through the receiving hole 159.

Figure 6:
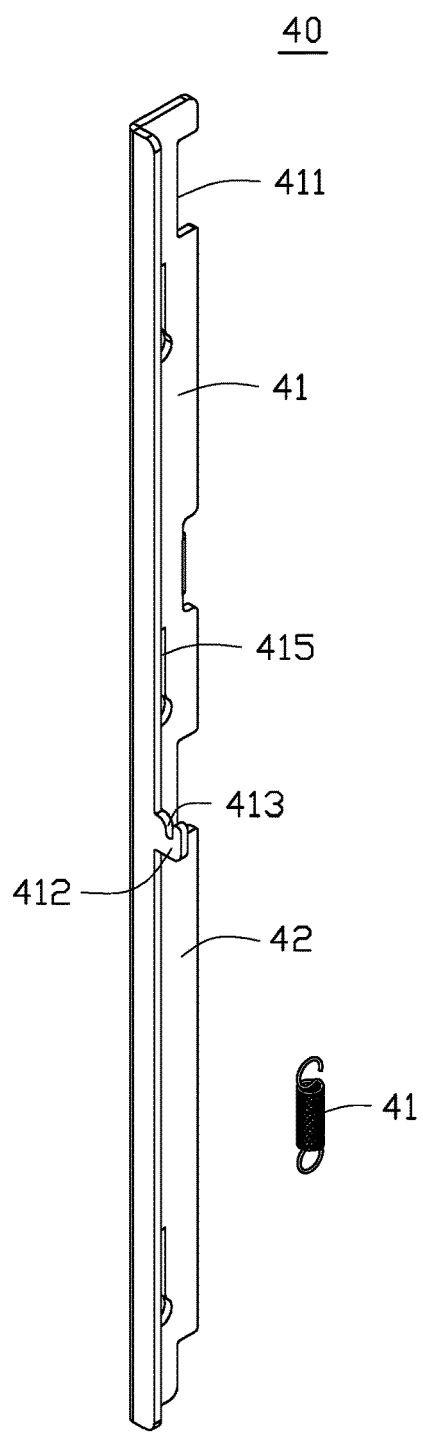
FIG. 6 is an exploded, isometric view of a sliding module of the securing apparatus of FIG. 1.

FIG. 6 illustrates that the sliding module 40 can include a sliding pole 41, a retaining plate 412 extending from the sliding pole 41, and a second resilient member 42. The sliding pole 41 defines a plurality of latching slots 411 and two sliding slots 415. The retaining plate 412 defines a limiting slot 413.

FIGS. 4 and 5 further illustrate that the switch module 50 can include a switch 51, a fastener 52, and a third resilient member 53. The switch 51 defines a recess 511, and the fastener 52 is capable of being inserted into the positioning hole 153 of the panel 10 through the recess 511 to slidably mount the switch 51 in to the panel 10. A limiting post 515 extends from a side of the switch 51. The third resilient member 53 is located on the limiting post 515 with opposite ends abutting the limiting plate 152 and the switch 51. The switch 51 further defines an opening 516. A protrusion 517 extends from a side of the switch 51 in a side of the opening 516. The blocking plate 313 is elastically deformable to slide the blocking pole 314 over the protrusion 517.

Figure 7:
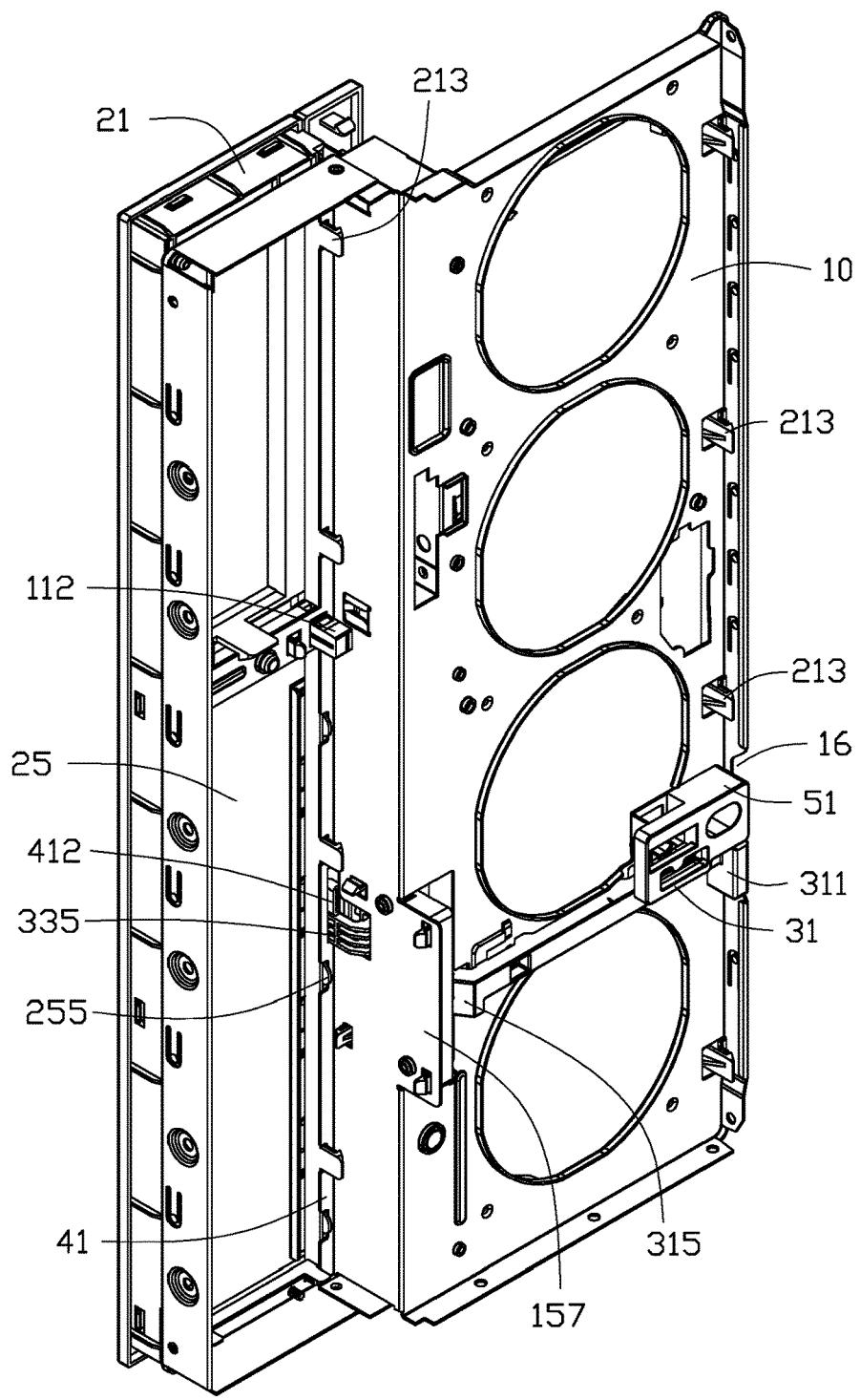
FIG. 7 is an assembled, isometric view of the securing apparatus and the panel of FIG. 1, showing a rotating plate mounted to the sliding module.
Figure 8:
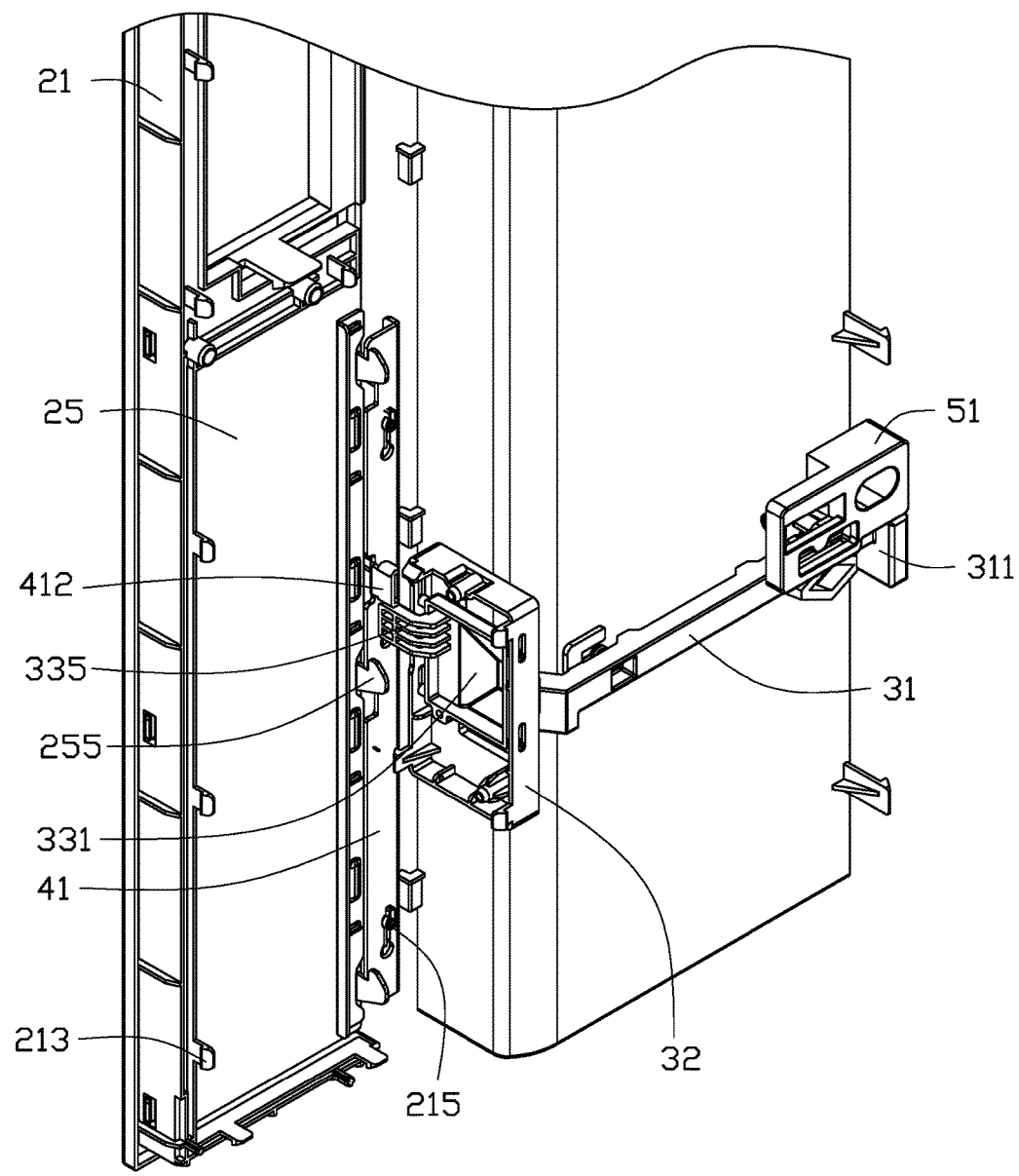
FIG. 8 is similar to FIG. 7, but without the panel.

FIGS. 7 and 8 illustrate that in assembly the sliding posts 312 are engaged in the sliding slots 156 to slidably mount the operation pole 31 to the rear surface 15 of the panel 10. Opposite ends of the first resilient member 34 are engaged in the latching holes 318 and 155. The sliding member 33 is moved to place the protrusion 331 in the through hole 322 and the sliding shafts 333 are inserted into the sliding slots 327, so that the sliding member 33 is slidably mounted to the bracket 32 with one of the slant surfaces 332 abutting one of the guiding surfaces 316. The pushing plate 335 extends through the receiving hole 159. The hooks 326 latch elastically in the installation holes 158 to secure the bracket 32 to the panel 10. Thus, the pressing module 30 is mounted to the panel 10 with the operation plate 311 aligned with the cutout 16.

The sliding pole 41 is moved to be adjacent to the aperture 211. The sliding posts 215 are inserted into the sliding slots 415 to slidably mount the sliding pole 41 to the frame 21. The retaining plate 412 abuts the pushing plate 335. The second resilient member 42 is elastically deformed with opposite ends latching in the limiting slot 413 and in the limiting block 216.

The third resilient member 53 is located on the limiting post 515. The switch 51 is placed in the rear surface 15. The limiting post 515 extends through the limiting hole 1521. Opposite ends of the third resilient member 53 abut the limiting plate 152 and the switch 51. The recess 511 is aligned with the positioning hole 153 and the fastener 52 is inserted into the positioning hole 153 through the recess 511 to slidably mount the switch 51 to the panel 10. In this position, the switch module 50 is slidably mounted to the panel 10, the blocking pole 314 is received in the opening 516, and the switch 51 is aligned with the cutout 16.

The posts 252 are engaged in the pivoting holes 212 to pivotably mount the rotating plate to the frame 21. The shielding assembly 20 is moved to be adjacent to the front surface 11 with the aperture 211 aligned with the opening 111. The hooks 213 elastically deform to engage in the latching slots 151 to secure the shielding assembly 20 to the panel 10. The data storage device is placed in the enclosure through the aperture 211 and the opening 111 and the rotating plate 20 is rotated to engage the hooks 255 in the latching slots 411 extending out of the sliding pole 41. The pin 256 is inserted into the locking member 112. Thereby, the data storage device is received in the enclosure, and the securing apparatus 100 is secured to the panel 10.

Figure 9:
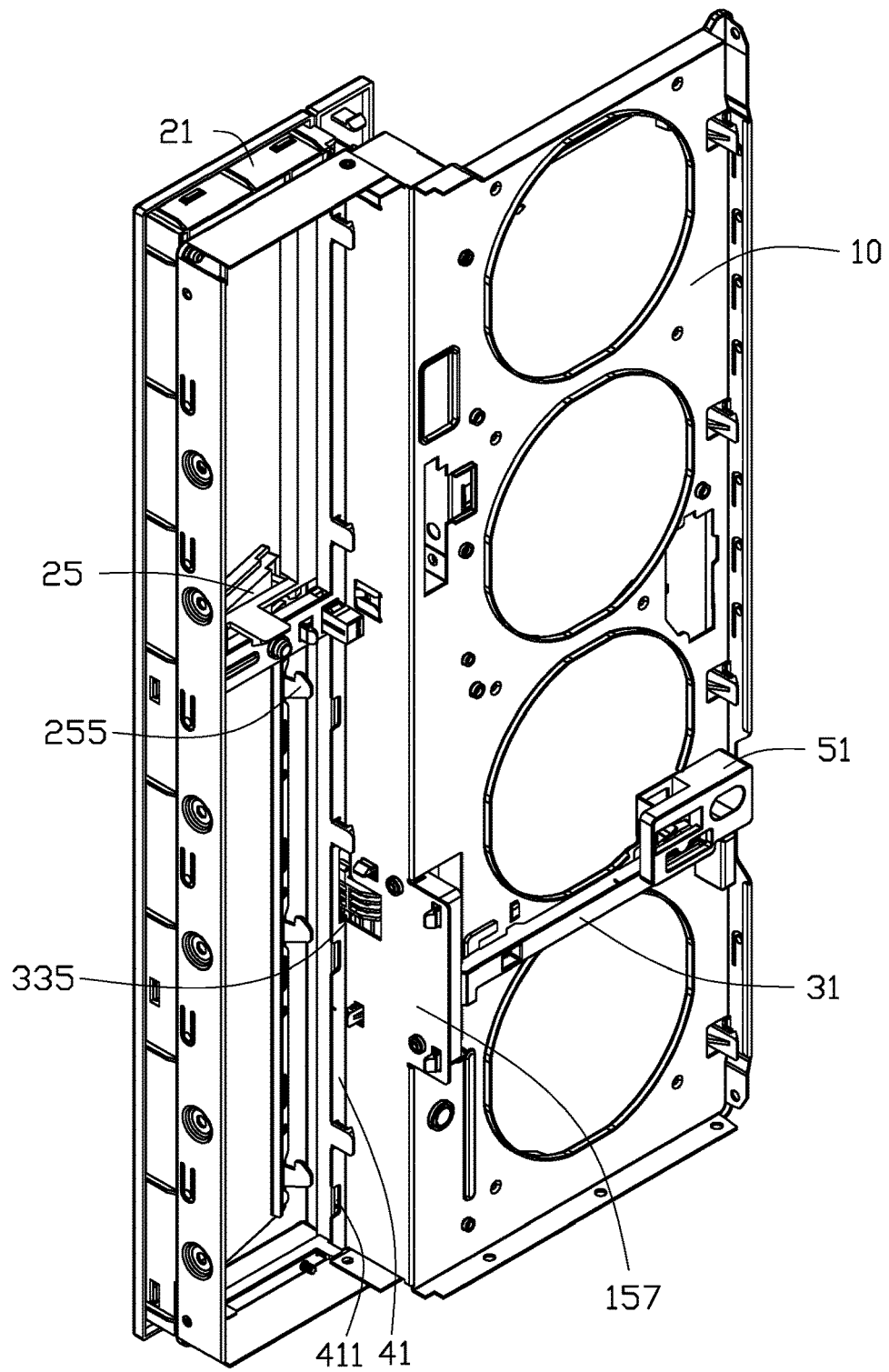
FIG. 9 is another assembled, isometric view of the securing apparatus and the panel of FIG. 1, showing the rotating plate detached from the sliding module.
Figure 10:
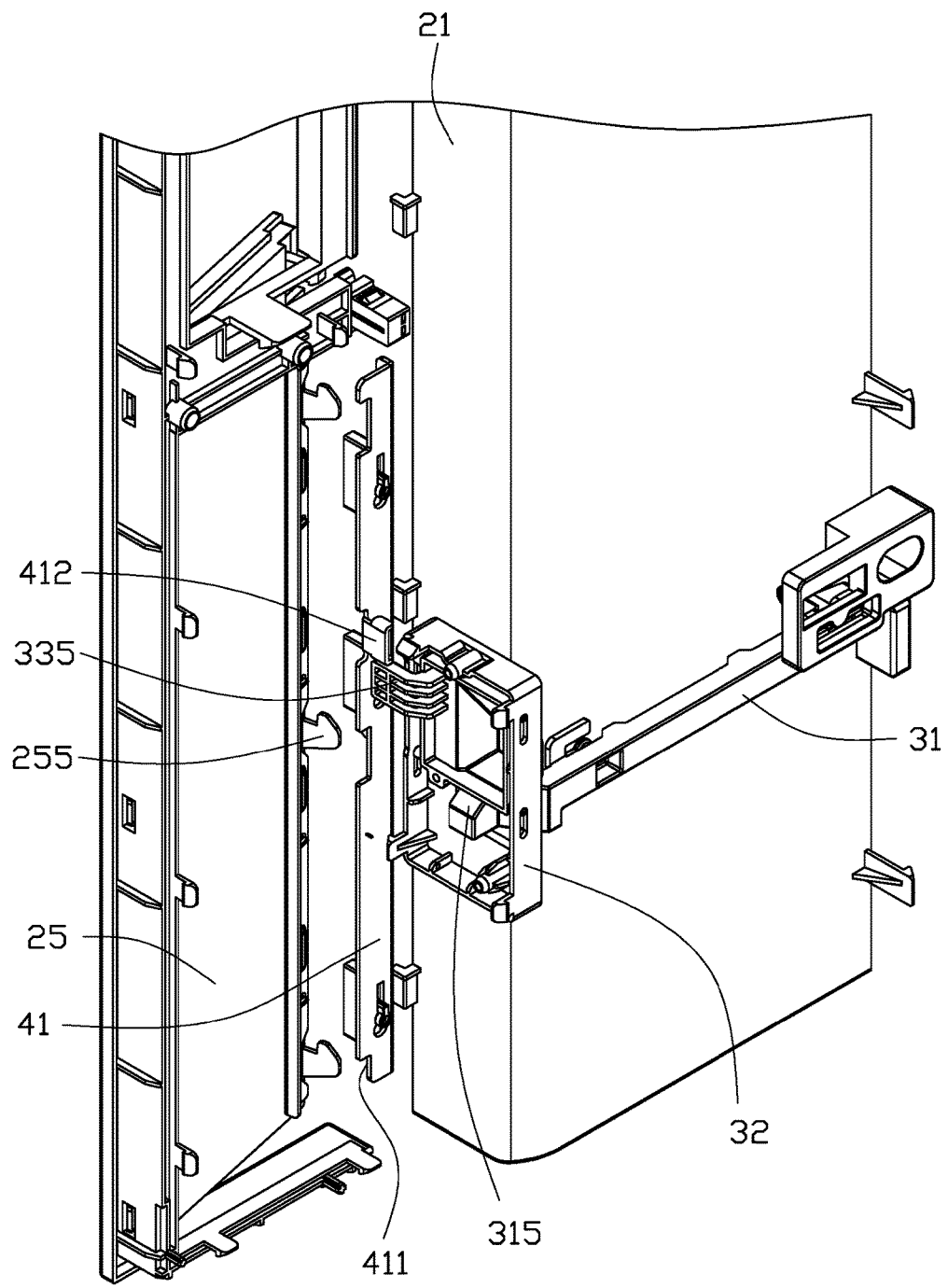
FIG. 10 is similar to FIG. 9, but without the panel.

FIGS. 9 and 10 illustrate that to disassemble the date storage device, the operation pole 31 is pressed from the cutout 16, the first resilient member 34 being elastically deformed. The operation pole 31 is slid along the sliding slot 156 and the blocking plate 313 is elastically deformed to pass over the protrusion 517. The guiding surface 316 resists the slant surface 332 and pushes the sliding member 33 with the sliding shafts 333 sliding upwards in the sliding slot 327. The pushing plate 335 slides the sliding pole 41 upwards by pushing against the pressing plate 412, and the second resilient member 42 is elastically deformed. When the hooks 255 are disengaged from the latching slots 411, the protrusion 517 abuts the blocking plate 313 to prevent the operation pole 31 from moving back. The pin 256 is pressed to disengage from the locking member 112. The rotating plate 25 can then be rotated to take the data storage device out of the enclosure.

Figure 11:
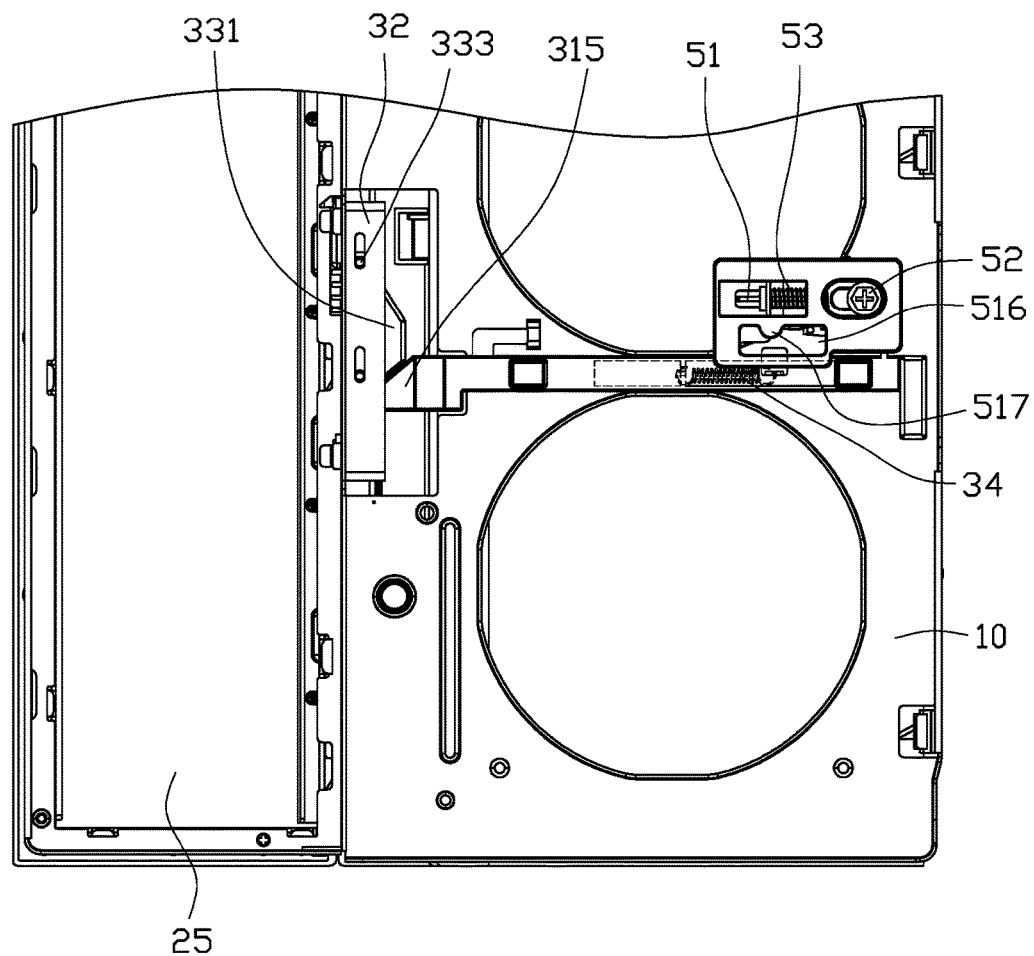
FIG. 11 is a front view of the assembled securing apparatus and the panel, showing the rotating plate mounted to the sliding module of FIG. 6.

Referring to FIGS. 7, 8, and 11, when the data storage device needs to be locked, the rotating plate 25 is rotated to insert the pin 256 into the locking member 112. The switch 51 is pressed, the recess 511 is slid relative to the fastener 52, and the third resilient member 53 is elastically pressed. The protrusion 517 presses against the blocking pole 314 to elastically deform the blocking plate 313, the first resilient member 34 rebounds to slide the operation pole 31 towards the aperture 16, the pressing block 315 is disengaged from the protrusion 331, and the sliding member 33 is slid downwards relative to the sliding slot 327. The pushing plate 335 slides over the pressing plate 412, and the second resilient member rebounds to slide the sliding pole 41 downwards. The hooks 255 are engaged in the latching slots 411 to prevent the rotating plate 25 from being rotated. The data storage device is thereby locked in the enclosure.

The embodiments shown and described above are only examples. Many details are often found in the art such as the other features of a securing apparatus. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A securing apparatus, configured to mount a data storage device in an enclosure, comprising:
a shielding assembly configured to be secured to a panel of the enclosure and comprising a frame and a rotating plate rotatably mounted to the frame;
a sliding pole slidably mounted to the frame and defining a plurality of latching slots; and
a pressing module slidably mounted to the panel;
wherein the frame defines an aperture for the data storage device to pass through; the rotating plate comprises a plurality of first hooks; the sliding pole is slidable relative to the frame to engage the first hooks in the latching slots, and the rotating plate is secured to the frame and shields the aperture, preventing the data storage device from being taken out of the aperture, the pressing module is slidable relative to the panel to push the sliding pole, and for disengaging the first hooks from the latching slots, and the rotating plate is rotatable relative to the frame to open the aperture, the pressing module comprises an operation pole, and the operation pole comprises two sliding posts, the panel defines two sliding slots, and the two sliding posts are slidably received in the two sliding slots, the pressing module further comprises a bracket secured to the panel and a sliding member slidably mounted to the bracket, and the operation pole is slidable relative to the frame to slide the sliding member, the bracket comprises a plurality of second hooks, the panel comprises an installation plate defining a plurality of installation holes, and the second hooks are latchable in the installation holes to secure the bracket to the panel.

2. The securing apparatus of claim 1, wherein the bracket defines a plurality of sliding slots, the sliding member comprises two sliding shafts, and the two sliding shafts are slidably inserted in the two sliding slots.

3. The securing apparatus of claim 1, wherein the sliding member comprises a first protrusion, the operation pole comprises a pressing block, and the pressing block abuts the first protrusion.

4. The securing apparatus of claim 1, wherein the sliding member further comprises a pushing plate, the sliding pole further comprises a retaining plate, and the pushing plate abuts the retaining plate.

5. The securing apparatus of claim 1 wherein the frame comprises a plurality of sliding posts, the sliding pole defines a plurality of sliding slots, the sliding posts are slidably inserted in the sliding slots.

6. The securing apparatus of claim 1, further comprising a switch slidably mounted to the panel, wherein the switch defines an opening and comprises a second protrusion in the opening; the operation pole comprises a blocking plate and a blocking pole extending from an end of the blocking plate, the blocking pole is received in the opening, and the second protrusion abuts the blocking pole.

7. A securing apparatus, configured to mount a data storage device in an enclosure, comprising:
an enclosure configured to receive a data storage device and comprising a panel;
a shielding assembly secured to the panel and comprising a frame and a rotating plate rotatably mounted to the frame;
a sliding pole slidably mounted to the frame and defining a plurality of latching slots; and
a pressing module slidably mounted to the panel;
wherein the frame defines an aperture for the data storage device to pass through; the rotating plate comprises a plurality of first hooks; and the sliding pole is slidable relative to the frame to engage the first hooks in the latching slots, and the rotating plate is secured to the frame and shields the aperture, preventing the data storage device from being taken out of the aperture, the pressing module is slidable relative to the panel to push the sliding pole, and for disengaging first hooks from the latching slots, and the rotating plate is rotatable relative to the frame to open the aperture, the pressing module comprises an operation pole, and the operation pole comprises two sliding posts; the panel defines two sliding slots; the two sliding posts are slidably received in the two sliding slots, the pressing module further comprises a bracket secured to the panel and a sliding member slidably mounted to the bracket, and the operation pole is slidable relative to the frame to slide the sliding member, the bracket defines a plurality of sliding slots, the sliding member comprises two sliding shafts, and the two sliding shafts are slidably inserted in the two sliding slots.

8. The securing apparatus of claim 7, wherein the bracket comprises a plurality of second hooks, the panel comprises an installation plate defining a plurality of installation holes, and the second hooks are latched in the installation holes to secure the bracket to the panel.

9. The securing apparatus of claim 7, wherein the sliding member comprises a first protrusion, the operation pole comprises a pressing block, and the pressing block abuts the first protrusion.

10. The securing apparatus of claim 7, wherein the sliding member further comprises a pushing plate, the sliding pole further comprises a retaining plate, and the pushing plate abuts the retaining plate.

11. The securing apparatus of claim 7, wherein the frame comprises a plurality of sliding posts, the sliding pole defines a plurality of sliding slots, the sliding posts are slidably inserted in the sliding slots.

12. The securing apparatus of claim 7, further comprising a switch slidably mounted to the panel, wherein the switch defines an opening and comprises a second protrusion in the opening; the operation pole comprises a blocking plate and a blocking pole extending from an end of the blocking plate, the blocking pole is received in the opening, and the second protrusion abuts the blocking pole.

* * * * *